US009909212B2

(12) United States Patent
Alasaarela et al.

(10) Patent No.: US 9,909,212 B2
(45) Date of Patent: Mar. 6, 2018

(54) APPARATUS FOR PROCESSING SUBSTRATE SURFACE

(75) Inventors: Tapani Alasaarela, Helsinki (FI); Pekka Soininen, Helsinki (FI)

(73) Assignee: BENEQ OY, Vantaa (FI)

( * ) Notice: Subject to any disclaimer, the term of this patent is extended or adjusted under 35 U.S.C. 154(b) by 814 days.

(21) Appl. No.: 13/817,082

(22) PCT Filed: Aug. 22, 2011

(86) PCT No.: PCT/FI2011/050732
§ 371 (c)(1),
(2), (4) Date: Apr. 1, 2013

(87) PCT Pub. No.: WO2012/028771
PCT Pub. Date: Mar. 8, 2012

(65) Prior Publication Data
US 2013/0199446 A1 Aug. 8, 2013

(30) Foreign Application Priority Data

Aug. 30, 2010 (FI) ...................................... 20105903

(51) Int. Cl.
*C23C 16/00* (2006.01)
*C23C 16/50* (2006.01)
(Continued)

(52) U.S. Cl.
CPC ...... *C23C 16/45544* (2013.01); *C23C 16/458* (2013.01); *C23C 16/545* (2013.01)

(58) Field of Classification Search
USPC .................. 118/715–733; 156/345.1–345.55
See application file for complete search history.

(56) References Cited

U.S. PATENT DOCUMENTS 4,928,625 A * 5/1990 Woods .................... B05B 13/04
118/323
6,132,516 A * 10/2000 Hayashi .................. C23C 14/34
118/718
(Continued)

FOREIGN PATENT DOCUMENTS

EP 2 159 304 A1 3/2010
JP A-55-120142 9/1980
(Continued)

OTHER PUBLICATIONS

Swing. (n.d.) American Heritage® Dictionary of the English Language, Fifth Edition. (2011). Retrieved Dec. 9, 2016 from http://www.thefreedictionary.com/swing.*
(Continued)

*Primary Examiner* — Karla A Moore
*Assistant Examiner* — Tiffany Z Nuckols
(74) *Attorney, Agent, or Firm* — Robert P. Michal, Esq.; Carter, DeLuca, Farrell & Schmidt, LLP

(57) ABSTRACT

Disclosed is an apparatus for processing a surface of a substrate by subjecting the surface of a substrate to successive surface reactions of at least a first precursor and a second precursor. The apparatus includes at least one nozzle head having two or more two or more precursor zones for subjecting the surface of the substrate to at least the first and second precursors and a moving mechanism for moving the nozzle head in oscillating movement between a first end position and a second end position. The moving mechanism is arranged to store at least part of the kinetic energy of the nozzle head released in oscillating movement of the nozzle head.

16 Claims, 2 Drawing Sheets

(51) Int. Cl.
*C23F 1/00* (2006.01)
*H01L 21/306* (2006.01)
*C23C 16/455* (2006.01)
*C23C 16/458* (2006.01)
*C23C 16/54* (2006.01)

(56) References Cited

U.S. PATENT DOCUMENTS

| | | | |
|---|---|---|---|
| 2004/0079286 A1 | 4/2004 | Lindfors | |
| 2005/0172897 A1 | 8/2005 | Jansen | |
| 2005/0268856 A1* | 12/2005 | Miller et al. | 118/729 |
| 2007/0281106 A1* | 12/2007 | Lubomirsky | C23C 16/401 427/569 |
| 2009/0081886 A1* | 3/2009 | Levy | C23C 16/45551 438/790 |
| 2010/0148517 A1* | 6/2010 | Duclos | F03G 3/06 290/1 C |
| 2010/0209614 A1* | 8/2010 | Sakata | H01L 21/02 427/402 |
| 2011/0240225 A1* | 10/2011 | Yamada | B65H 23/0322 156/390 |
| 2015/0184295 A1 | 7/2015 | Jeong | |

FOREIGN PATENT DOCUMENTS

| | | |
|---|---|---|
| JP | A-11-162394 | 6/1999 |
| JP | 2004-036004 A | 2/2004 |
| JP | A-2009-52063 | 3/2009 |
| JP | 2015-527485 A | 9/2015 |
| WO | WO 2008/085467 A1 | 7/2008 |
| WO | WO 2009/031886 A2 | 3/2009 |

OTHER PUBLICATIONS

Pendulum. (n.d.) American Heritage® Dictionary of the English Language, Fifth Edition. (2011). Retrieved Dec. 9, 2016 from http://www.thefreedictionary.com/pendulum.*
Dec. 14, 2011 International Search Report issued in International Patent Application No. PCT/FI2011/050732.
May 23, 2011 Search Report issued in Finnish Patent Application No. 20105903 (with translation).
Sep. 5, 2014 Office Action issued in Chinese Patent Application No. 201180041749.5 (with translation).
Sep. 24, 2015 Office Action issued in Taiwanese Patent Application No. 100130645.

* cited by examiner

APPARATUS FOR PROCESSING SUBSTRATE SURFACE

BACKGROUND OF THE INVENTION

The present invention relates to an apparatus for processing a surface of a flexible substrate by subjecting the surface of a substrate to successive surface reactions of at least a first precursor and a second precursor, and particularly to an apparatus according to the preamble of claim 1.

In the prior art several types of apparatuses, apparatuses and nozzle heads are used for subjecting a surface of a substrate to successive surface reactions of at least a first precursor and a second precursor according to the principles of atomic layer deposition method (ALD). In ALD applications, typically two gaseous precursors are introduced into the ALD reactor in separate stages. The gaseous precursors effectively react with the substrate surface, resulting in deposition of a single atomic layer. The precursor stages are typically followed or separated by a purge stage that eliminates the excess precursor from the surface of the substrate prior to the separate introduction of the other precursor. Therefore an ALD process requires alternating in sequence the flux of precursors to the surface of the substrate. This repeated sequence of alternating surface reactions and purge stages between is a typical ALD deposition cycle.

The prior art ALD-apparatuses usually comprise a nozzle head having one or more first precursor zones for subjecting the surface of the substrate to the first precursor, one or more second precursor zones for subjecting the surface of the substrate to the second precursor, and one or more purge gas zones or purge gas zones arranged between the first and second precursor zones for subjecting the surface of the substrate to a purge gas. The zones are arranged alternatively in succession to the nozzle head: first precursor zone, purge gas zone, second precursor zone, purge gas zone, first precursor zone, purge gas zone, second precursor zone, and so on. Therefore when the nozzle head is moved on the substrate surface it will produce growth layers according to the principles of ALD method. The nozzle head may also comprise discharge channels arranged between the first and second precursor zone or between a first precursor zone and a purge gas zone or between a second precursor zone and a purge gas zone. The discharge channel is arranged to exhaust precursor and purge gas after the surface of the substrate is subjected to it. Alternatively each of these prior art precursor zones and purge gas zones comprise at least one inlet port for supplying the precursor or purge gas and at least one outlet port for exhausting the precursor or purge gas. Thus there is provided suction to each of the zones for exhausting the precursor or purge gas after the substrate is subjected to it.

As only one atomic layer is produced on the surface of the substrate during one ALD-cycle, the nozzle head is formed to comprise several first and second zones such that a single scan with the nozzle head over the surface of the substrate forms several atomic layers on the surface of the substrate. The single scan with the nozzle head may be done by moving either the nozzle head or the substrate. In the prior art the number of scan with the nozzle head is increasing by moving the nozzle head with a linear movement back and forth by a moving mechanism using fast speed for performing multiple scans over the surface of the substrate.

This prior art way for producing several atomic layer has the disadvantage that the back and forth movement with the moving mechanism produces great mechanical forces the nozzle head has to stand. The forces are especially high as the nozzle head has be stopped in the end position and accelerated again. Therefore the apparatus and the nozzle head are susceptible to damages as the acceleration and deceleration are carried by a motor. Furthermore, the oscillating back and forth movement between the end positions requires accelerating the nozzle head over and over again which consumes a lot of energy.

BRIEF DESCRIPTION OF THE INVENTION

Thus the object of the present invention is to provide an apparatus such that the above mentioned prior art problems are solved. The objects of the present invention are achieved with an apparatus according to the characterizing portion of claim 1, characterized in that the moving mechanism is arranged to store at least part of the kinetic energy of the nozzle head released in oscillating movement of the nozzle head.

The preferred embodiments of the present invention are described in dependent claims.

The present invention is based on the idea of providing an apparatus comprising a nozzle for subjecting a surface of a substrate to surface reactions at least a first and second precursor. The apparatus further comprises a moving mechanism for moving the nozzle head by an oscillating movement between a first end position and a second end position. This means that the nozzle head is moved to a first direction until it reaches a first end position and then the nozzle head is moved to a second direction until it reaches the second end position. In a normal situation the nozzle head is accelerated as it moves away from the first end position and then decelerated as it approaches the second end position and it stops to the second end position before being accelerated again towards the first end position. During the deceleration the kinetic energy of the nozzle head is reduced and thus there is energy to be released from the nozzle head. The apparatus comprises a moving mechanism for moving the nozzle head by oscillating movement between the first and second end positions. According to the present invention the moving mechanism is arranged to store at least part of the kinetic energy of the nozzle head released in oscillating movement of the nozzle head. Thus means that the moving mechanism is arranged to store at least part of the kinetic energy of the nozzle head released in decelerating the nozzle head as it approaches the end positions. In some applications of the present invention the kinetic energy of the nozzle head is stored or converted to another form of energy as the nozzle head is decelerated when it approaches an end position. In other words the nozzle head is decelerated by storing or converting the kinetic energy of the nozzle head.

The kinetic energy of the nozzle head may be stored as potential energy, such as gravitational potential energy, spring potential energy or potential energy of pressure medium. Alternatively the kinetic energy of the nozzle head may be stored as electrical energy or magnetic energy. The kinetic energy of the nozzle head may also be stored to a kinetic energy element such as a flywheel. The stored or converted kinetic energy of the nozzle head may be used for accelerating the same or another nozzle head. Alternative the stored or converted kinetic energy may be used for some other purpose or even supplied to electricity network.

The present invention has the advantage that it provides an apparatus having a moving nozzle head which has low energy consumption. Furthermore the present invention decreases the stresses and forces subjected to the apparatus due to the moving of the nozzle head. Decelerating the nozzle head by storing or converting the kinetic energy of the nozzle head to another form of energy provides a smooth way for decelerating the nozzle head. Therefore no high stress peaks are formed.

BRIEF DESCRIPTION OF THE FIGURES

In the following the invention will be described in greater detail, in connection with preferred embodiments, with reference to the attached drawings, in which.

DETAILED DESCRIPTION OF THE INVENTION

Figure 1:
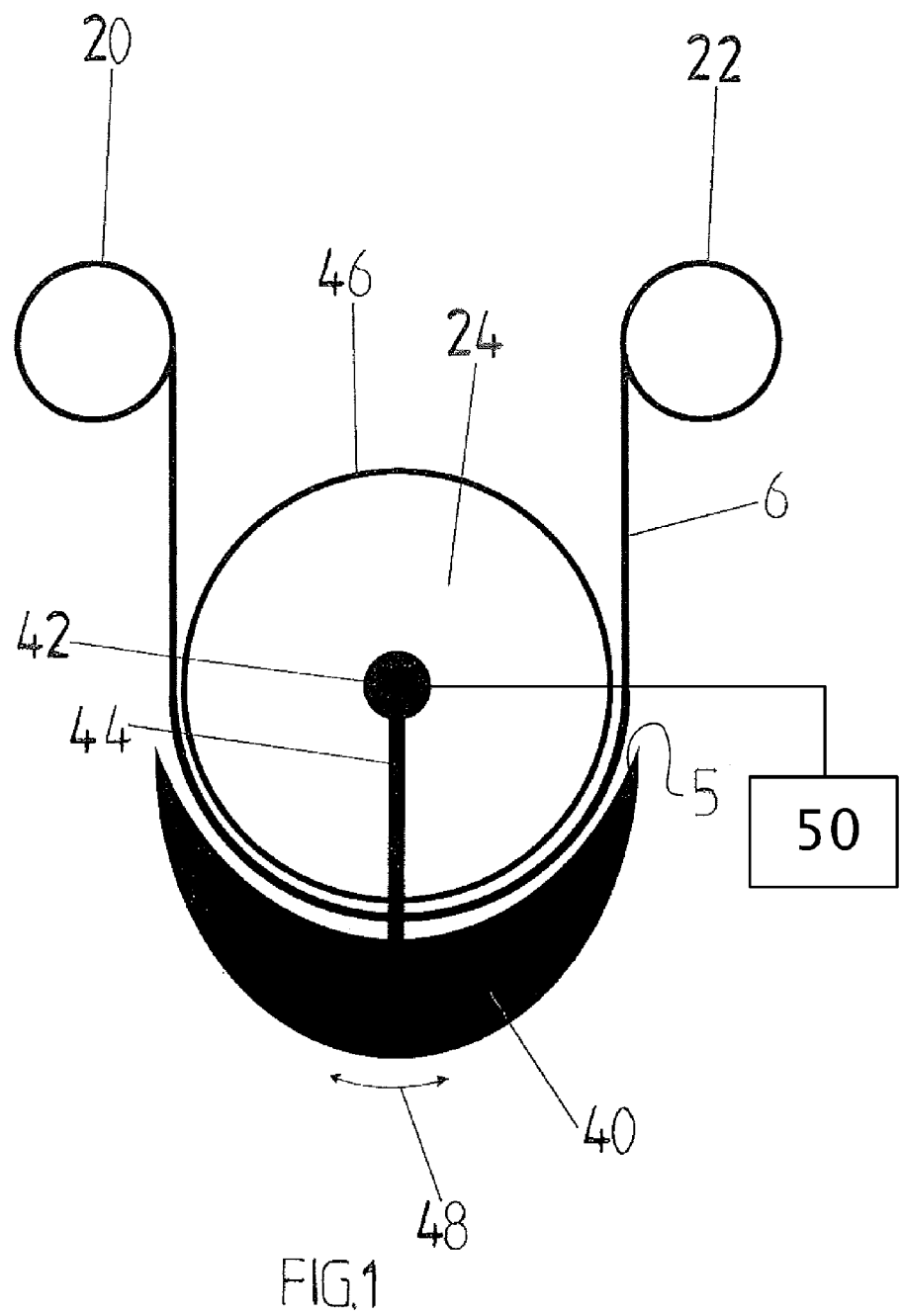
FIG. 1 is a schematic view showing one embodiment of the apparatus according to the present invention.

FIG. 1 shows schematically one embodiment of the apparatus of the present invention. The apparatus comprises a transport cylinder 24 having a circular or cylindrical outer surface 46. The apparatus may also comprise only one or more than two transport cylinders 24. The transport cylinder 24 may be stationary or alternatively they may rotate around the central axis 42 of the transport cylinder 24. As shown in FIG. 1 a substrate 6 is transported along a transport path such that the substrate is transported along at least a part of the outer surface 46 of the transport cylinder 24. In FIG. 1 the substrate 6 is supplied from a first substrate roll 20 to the transport cylinder 24 and further to a second substrate roll 22. The first and second substrate roll 20, 22 may also be replaced by some other kind of receptacle for supplying, receiving and storing elongated substrate 6.

The flexible substrate 6 may be any elongated and flexible substrate. The present invention however is not restricted to any type substrate, but the substrate and the moving nozzle head may be any kind. In this context the substrate means a substrate itself or a powder like, particle like or separate parts or objects installed on an elongated and flexible substrate carrier or another substrate carrier. The precursors used may comprise any precursors suitable for atomic layer deposition, such as ozone, TMA (trimethylaluminium), water, $TiCl_4$, DEZ (diethylzinc), or precursor may also be plasma, such as $NH_3$, Ar, $O_2$, $N_2$, $H_2$ or $CO_2$ plasma. Purge gas used in the nozzle head cylinder 2 may comprise inert gas, such as nitrogen, dry air, or any other gas suitable to be used as purge gas in atomic layer deposition. Also plasma may be used for purging, for example nitrogen or argon plasma. In that this context purge gases and precursors comprise also plasma.

In FIG. 1 the substrate 6 is shown to be transported about 180 degrees on the outer surface 46 of the transport cylinder 24. However, it should be noted that the substrate may also be transport only 45 degrees or more, preferably 90 degrees or even at least a sector of 270 degrees or more along the outer surface 46 of the transport cylinder 24. The substrate 6 may be transported along the outer surface 46 of the transport cylinder 24 by rotating the transport cylinder 24 with a same speed as substrate 6 is transported. Alternatively the transport cylinder 24 is provided with a slide surface on the outer surface 46 of the transport cylinder 24 such that the substrate 6 may slide along the outer surface 46. In an alternative embodiment the outer surface 46 of the transport cylinder is provided with one or more transport elements (not shown) for guiding the substrate 6 along the outer surface 46 and enhancing the movement of the substrate 6. The transport elements may are formed as transport rollers extending substantially in the direction of the central axis of the transport cylinders 24. The transport rollers may be freely rotating rollers or driven rollers. The transport element may also be for example a conveyor belt rotating around outer surface 46 of the transport cylinder 24. It should be noted that in this context a cylindrical cylinder or a cylindrical surface mean also slightly conical cylinders. In other words the cylinder may comprise a narrow part for example in the middle of the cylinder for guiding a substrate 6.

The apparatus is further provided with a nozzle head 40. The nozzle head 40 is arranged in connection with the transport cylinder 24. However, it is also possible to arrange two or more nozzle heads 40 in connection with the transport cylinder 24. The two or more nozzle heads 40 may be arranged in parallel or in series relative to the each other, in other words adjacent to each other or in succession. The nozzle head 40 comprises an output face 5 from which the process gases are supplied and exhausted. In this context the output face 5 means the surface of the nozzle head 40 which is towards the substrate 6. The output face 5 also means the part of the surface towards the substrate which comprises process gas nozzles and discharge channels. The precursors and purge gas may be supplied to the nozzle head 2 via fluid connections. Alternatively the nozzle head 2 is provided with one or more precursor and/or purge gas containers, bottles or the like such that the precursors and/or the move together with the nozzle if the nozzle head is moved. This arrangement decreases the number of difficult fluid connections to a moving nozzle head 2.

The output face 5 of the nozzle head is formed conform a portion of a cylindrical surface, as shown in FIG. 1. In other words the output face 5 is formed as concave surface or an arc surface cut off from a cylindrical surface. The output face 5 is further formed such that it may be positioned over, above or on the transport surface 46. Therefore the output face 5 is formed to substantially conform the transport surface 46. This means that the output face 5 and the transport surface 46 preferably have substantially same shape. The nozzle head 2 is positioned such that there is gap between the output face 5 and the transport surface 46. The elongated substrate 6 is arranged to be transported in the gap between the output face 5 and the transport surface 46. Thus when substrate 6 is transported on the transport surface 46, the substrate 6 and the output face 5 form together a reaction space. In a preferred embodiment the output face 5 is positioned at a substantially constant distance from the transport surface 46 along the length of the transport surface 46. This is achieved such that the transport cylinder 24 has a first radius and the output face 5 of the nozzle head 40 has a second radius larger than the first radius. Thus the output face 5 of the nozzle head 2 and the outer surface 46 of the transport cylinder 24 are arranged coaxially for providing a substantially constant distance between the outer surface 46 and the output face 5. As shown in FIG. 1, the output face 5 of nozzle head 40 is arranged to process the substrate 6 substantially along the whole sector on which the substrate 6 is transported along the outer surface 46 of the transport cylinder 24. In an alternative embodiment the output face 5 of the nozzle head 46 is arranged to process the substrate 6 only along a part of the sector on which the substrate 6 is transported along the outer surface 46 of the transport cylinder 24.

The apparatus comprises a moving mechanism for moving at least one nozzle head in relation to the transport cylinder 24. The moving mechanism is arranged to move the nozzle head 2 in an oscillating swing movement between a first end position and a second end position around the central axis 42 of the transport cylinder 24, as shown in FIG. 1. The nozzle head 40 is arranged to an end of a rod 44. Therefore the moving mechanism forms a pendulum for swinging the nozzle head 40 between the first and second end positions. As the nozzle head 40 moves in the oscillating movement, the nozzle head has maximum kinetic energy when the nozzle head 40 is at the lowest point shown in FIG. 1. As the nozzle head 40 moves towards the ends points the kinetic energy of the nozzle head 40 is decreased and the gravitational potential energy of the nozzle head 40 is increased as the nozzle head 40 moves up along the transport surface 46 from the position shown in FIG. 1. Thus at least part of the kinetic energy of the nozzle head is stored as gravitational potential energy. When the nozzle head 40 reaches the end position it stop and the kinetic energy is zero, but the gravitational potential energy is at maximum. Then the nozzle head 40 starts to move from the end position and the gravitational potential energy of the nozzle head 40 decreases and the kinetic energy increases until the nozzle head reaches again the position shown in FIG. 1. Thus the pendulum is arranged to store at least part of the kinetic energy of the nozzle head 40 into gravitational potential energy at the end positions of the swinging movement of the nozzle head 40. As shown in FIG. 1 the nozzle head 40 forms the weight of the pendulum. In an alternative embodiment a separate weight may be connected to the nozzle head 40 for providing the swinging movement of the nozzle head 40. Thus the nozzle head 40 arranged to move by pendulum movement at a substantially constant distance from the outer surface of the transport cylinder 46. A motor may be connected to the nozzle head 40 or to the moving mechanism for maintaining the pendulum movement.

According to the above described the moving mechanism is arranged to store at least part of the kinetic energy of the nozzle head 40 released in oscillating movement of the nozzle head 40, for example in kinetic energy storage element 50, and especially the moving mechanism is arranged to store at least part of the kinetic energy of the nozzle head 40 released in decelerating the nozzle head 40 as it approaches the end positions. The moving mechanism is arranged to use the stored kinetic energy for further moving the nozzle heads 40 or another nozzle. Alternatively the stored kinetic energy is used for other purposes in the apparatus or outside the apparatus. Furthermore, it should be noted that part of the kinetic energy or the nozzle head 40 may also be stored or converted to elastic potential energy, such as potential energy of a spring or a pressure medium. The pressure medium may be for example a gas space which is compressed as the nozzle head 40 approaches the end position. Part of the kinetic energy of the nozzle head may also be stored or converted to electrical potential energy or magnetic potential energy. The magnetic potential energy may be used for example providing the nozzle head 40 and the end positions of the nozzle head movement with magnets of the same polarity.

Figure 2:
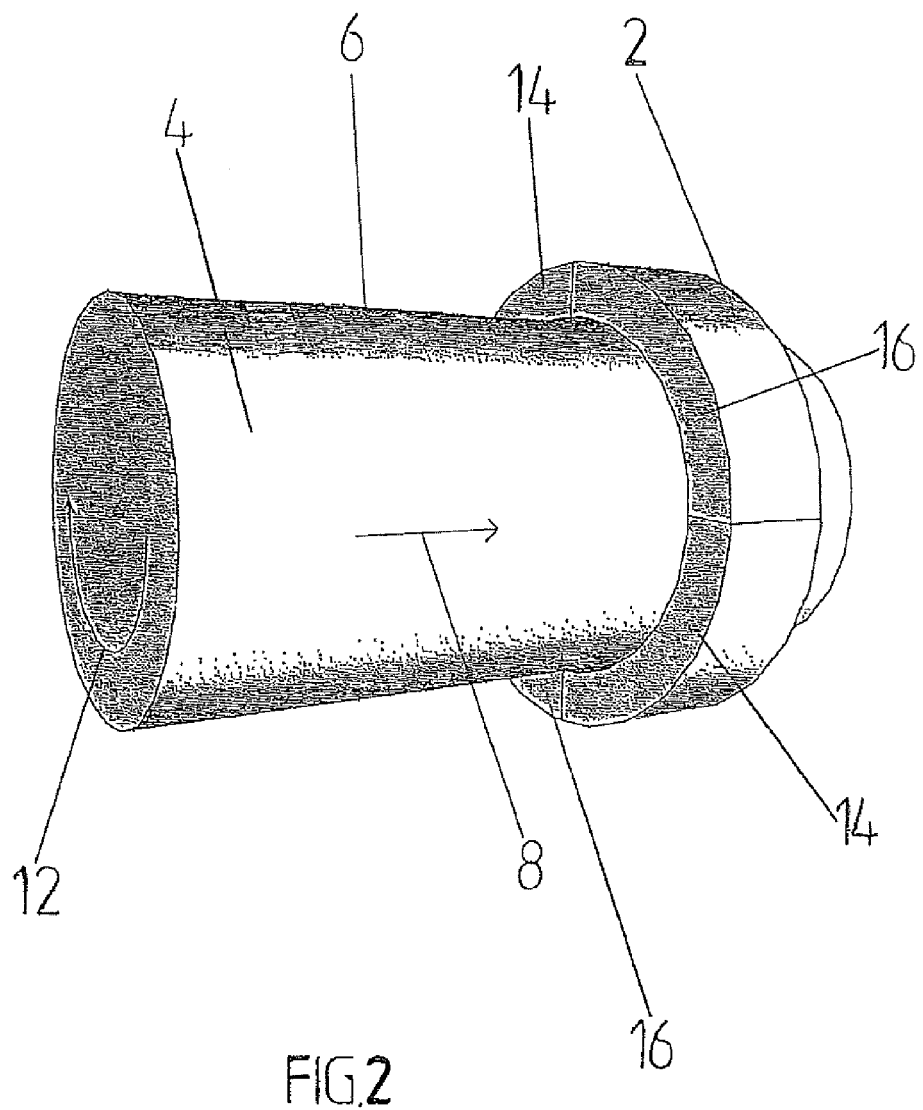
FIG. 2 is a schematic view showing another embodiment of the apparatus according to the present invention

FIG. 2 shows schematically another embodiment of the present invention. The apparatus for processing at least partly cylindrical surface comprises a nozzle head 2. In FIG. 2 the nozzle head 2 is a hollow cylinder having a central axis and substantially circular circumference wall. The circumference wall has an inner surface and an outer surface. In the embodiment of FIG. 1 the inner surface of the circumference wall is the output face of the nozzle head 2. The precursors are supplied through the output face for subjecting the surface of a substrate to precursors. The nozzle head 2 is thus arranged to process an outer surface 4 of cylindrical substrate 6 such that the cylindrical substrate 6 may be moved through the hollow nozzle head 2, as shown in FIG. 2. The first and second precursors may be any gaseous precursors which may be used in atomic layer deposition. Furthermore, plasma may also be used as precursor. Purge gas may be some inert gas such as nitrogen, plasma, or the like. The precursors and purge gas may be supplied to the nozzle head 2 via fluid connections. Alternatively the nozzle head 2 is provided with one or more precursor and/or purge gas containers, bottles or the like such that the precursors and/or the move together with the nozzle if the nozzle head is moved. This arrangement decreases the number of difficult fluid connections to a moving nozzle head 2.

The output face of the cylindrical nozzle head 2 is provided with one or more first precursor zones 14 for subjecting the surface 4 cylindrical substrate 6 to the a precursor, and one or more second precursor zones 16 for subjecting the surface 4 of the cylindrical object 6 to the second precursor. As seen in FIG. 2, the nozzle head 2 comprises two first precursor zones 14 and two second precursor zones 16 arranged alternatively in succession in the direction of the circumference wall and along the output face. When the cylindrical substrate 6 is rotated around the longitudinal axis in the direction of arrow 12 in FIG. 1, such that the surface 4 of the substrate 6 is subjected to the first and second precursor in the first and second precursor zones. The nozzle head 2 is also rotated around the central axis of the cylindrical nozzle head 2. The apparatus of FIG. 2 comprises a moving mechanism arranged to rotate the nozzle head 2 around the central axis in oscillating movement between a first and second end position. The movement mechanism comprises one or more springs which compress as the nozzle head 2 approaches the end position and decompress as the nozzle head 2 moves away from the end position. The nozzle head 2 of FIG. 2 may be arranged to rotate 45 degrees of more, preferably 180 or more or even over 360 degrees.

Also in the embodiment of FIG. 2 the kinetic energy of the nozzle may be alternatively stored as potential energy, as described above. Furthermore, the kinetic energy of the nozzle head 2 may stored as kinetic energy into a kinetic energy element (not shown). The kinetic energy element may be a flywheel or some other rotating element or moving element.

In an alternative embodiment the moving mechanism is arranged to move nozzle head in a conventional linear oscillating movement between the first and second end positions. The nozzle head may comprise a plane like output face for subjecting a surface of a substrate to the at least first and second precursors. The moving mechanism is arranged to move the nozzle head by oscillating back and forth movement and to convert at least part of the kinetic energy of the linear movement of the nozzle head into potential energy of a spring or a pressure medium or to store the kinetic energy of the nozzle head to kinetic energy of a rotating element or a flywheel.

The above described nozzle heads may comprise on the output face, in succession in the following order: a purge gas zone, a precursor nozzle and a discharge zone, optionally repeated a plurality of times. The purge gas zone, precursor zone and the discharge zone are arranged alternatively in succession in the direction of the circumference of the nozzle head. The nozzle head comprises on the output face in succession in the following order: a first precursor zone, a discharge zone, purge gas zone, a second precursor zone, a discharge zone and a purge gas zone, optionally repeated a plurality of times. The precursors are supplied though the precursor zones for subjecting the surface to surface reactions of the precursors. Purge gas is supplied in the purge gas zone and the precursors are discharged with the discharge zones using suction or vacuum. The precursor zones may be formed as channels extending substantially the same direction.

The above described arrangement provides a uniform gas flow along whole length of the precursor zone and the purge gas zone, and also a uniform discharge along the discharge zone. Therefore the precursor zones 14, 16 may be provided as precursor nozzles supplying precursors along the whole length of the precursor zone. Also purge gas zone may be provided as a purge gas nozzle supplying purge gas along the whole length of the purge gas zone and the discharge zone is arranged to discharge precursors and purge gas along the whole length of the discharge zone.

In an alternative embodiment the output face is provided in succession in the direction of the circumference of the nozzle head in the following order: a first precursor zone, a purge zone, a second precursor zone and a purge gas zone, optionally repeated a plurality of times. In this embodiment the first precursor zone is provided with at least one first inlet port for supplying the first precursor and at least one first outlet port for discharging the first precursor, and the second precursor zone is provided with at least one second inlet port for supplying the second precursor and at least one second outlet port for discharging the second precursor, and the purge zone is provided with at least one third inlet port for supplying purge gas. The purge gas zone may also comprise one or more third outlets or alternatively purge gas may be discharged through the outlet ports of the precursor zones. The inlet ports may be located for example to one end of a longitudinal precursor channel and purge gas channel and the outlet ports may be located to another end of the precursor channel or purge gas channel such that the purge gas and precursors may flow along the channels. Alternatively the inlet ports may be located substantially in the middle of a channel and the outlet ports to the opposite ends of a channel.

It should be obvious to a person skilled in the art that as the technology advantages, the inventive concept can be implemented in variety of ways. The invention and its embodiments are not restricted to the above examples, but may vary within the scope of the claims.

The invention claimed is:

1. An apparatus for processing a surface of a substrate by subjecting the surface of a substrate to successive surface reactions of at least a first precursor and a second precursor, the apparatus comprising:
    at least one nozzle head having two or more precursor zones for subjecting the surface of the substrate to at least the first and second precursors;
    a transport cylinder for transporting the substrate; and
    a moving mechanism for moving the nozzle head in relation to the transport cylinder in oscillating movement between a first end position and a second end position around a central axis of the transport cylinder,
    wherein the nozzle head is arranged in connection with the transport cylinder such that an output face of the nozzle head is formed to conform to a transport surface of the transport cylinder
    wherein the moving mechanism is arranged to move the nozzle head in oscillating movement between the first and second end positions around the central axis of the transport cylinder and to store at least part of the kinetic energy of the nozzle head released in the oscillating movement of the nozzle head,
    wherein the moving mechanism comprises a pendulum that swings the nozzle head in the oscillating movement between the first and second end positions, and
    wherein the pendulum is arranged to store at least part of the kinetic energy of the nozzle head into gravitational potential energy at the first and second end positions of the oscillating movement of the nozzle head.

2. An apparatus according to claim 1, wherein at least part of the moving mechanism is arranged to store at least part of the kinetic energy of the nozzle head released in decelerating the nozzle head as it approaches the end positions.

3. An apparatus according to claim 1, wherein at least part of the kinetic energy of the nozzle head is stored as potential energy.

4. An apparatus according to claim 3, wherein at least part of the kinetic energy of the nozzle head is stored as gravitational potential energy in at least one of the first and second end positions.

5. An apparatus according to claim 3, wherein at least part of the kinetic energy of the nozzle head is stored as elastic potential energy in at least one of the first and second end positions.

6. An apparatus according to claim 5, wherein at least part of the kinetic energy of the nozzle head is stored as potential energy of a spring or a pressure medium.

7. An apparatus according to claim 3, wherein at least part of the kinetic energy of the nozzle head is stored as electrical potential energy in at least one of the first and second end positions.

8. An apparatus according to claim 7, wherein the kinetic energy of the nozzle head is stored as magnetic potential energy.

9. An apparatus according to claim 1, wherein at least part of the kinetic energy of the nozzle head is stored to a kinetic energy element as kinetic energy.

10. An apparatus according to claim 1, wherein the kinetic energy element is a flywheel or a rotating element.

11. An apparatus according to claim 1, wherein the nozzle head forms the weight of the pendulum, or that a separate weight is connected to the nozzle head for providing the swinging movement of the nozzle head.

12. An apparatus according to claim 1, wherein the transport cylinder has an outer surface along which a flexible elongated substrate is transported, and the nozzle head is arranged to move by pendulum movement at a substantially constant distance from the outer surface of the transport cylinder.

13. An apparatus according to claim 1, wherein the nozzle head is formed as cylindrical nozzle head having a central axis and substantially circular circumference at a constant distance central axis, and that the moving mechanism is arranged to rotate the nozzle head around the central axis of the nozzle head by an oscillating rotational movement between the first and second end positions.

14. An apparatus according to claim 1 wherein the moving mechanism is arranged to store at least part of the rotational kinetic energy of the nozzle head into potential energy of a spring or a pressure medium at the end positions of the rotational movement of the nozzle head.

15. An apparatus according to claim 1 wherein the moving mechanism is arranged to store at least part of the rotational kinetic energy of the nozzle head into kinetic energy of a rotating element of a flywheel.

16. An apparatus according to claim 1, wherein the moving mechanism is arranged to use the stored kinetic energy for further moving the one or more nozzle heads.

* * * * *